(12) United States Patent
Bae et al.

(10) Patent No.: US 9,287,487 B2
(45) Date of Patent: Mar. 15, 2016

(54) TEXTILE-BASED STRETCHABLE ENERGY GENERATOR

(71) Applicant: SAMSUNG ELECTRONICS CO., LTD., Suwon-si (KR)

(72) Inventors: Ji-hyun Bae, Seoul (KR); Jong Jin Park, Hwaseong-si (KR); Sang-hun Jeon, Seoul (KR); Burak Guzelturk, Ankara (TR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 312 days.

(21) Appl. No.: 13/778,750

(22) Filed: Feb. 27, 2013

(65) Prior Publication Data

US 2014/0111063 A1    Apr. 24, 2014

(30) Foreign Application Priority Data

Oct. 19, 2012 (KR) .......... 10-2012-0116749

(51) Int. Cl.
| | |
|---|---|
| *H02N 2/18* | (2006.01) |
| *H01L 41/113* | (2006.01) |
| *H01L 41/047* | (2006.01) |
| *B82Y 99/00* | (2011.01) |
| *H01L 41/18* | (2006.01) |
| *H01L 41/193* | (2006.01) |

(52) U.S. Cl.
CPC .......... *H01L 41/0477* (2013.01); *H01L 41/113* (2013.01); *B82Y 99/00* (2013.01); *H01L 41/183* (2013.01); *H01L 41/193* (2013.01); *Y10S 977/948* (2013.01)

(58) Field of Classification Search
CPC ...................................................... H01L 41/193
USPC ........................................................ 310/339
See application file for complete search history.

(56) References Cited

U.S. PATENT DOCUMENTS

| | | | |
|---|---|---|---|
| 7,705,523 B2 | 4/2010 | Wang et al. | |
| 2002/0185937 A1* | 12/2002 | Heim et al. | 310/339 |
| 2006/0079619 A1* | 4/2006 | Wang et al. | 252/62.9 PZ |
| 2008/0212262 A1* | 9/2008 | Micallef | 361/502 |
| 2009/0066195 A1 | 3/2009 | Wang et al. | |
| 2009/0290614 A1 | 11/2009 | Gregory et al. | |
| 2010/0176691 A1* | 7/2010 | Boersma | 310/339 |
| 2011/0050042 A1* | 3/2011 | Choi et al. | 310/339 |
| 2011/0062134 A1 | 3/2011 | Lochtman et al. | |
| 2011/0163636 A1* | 7/2011 | Sirbuly et al. | 310/339 |

(Continued)

FOREIGN PATENT DOCUMENTS

| | | |
|---|---|---|
| KR | 10-2012-0056486 A | 6/2012 |
| KR | 10-1182341 B1 | 9/2012 |

OTHER PUBLICATIONS

Gokhale, NM, Fabrication of PZT-polymer Composite Materials Having 3-3 Connectivity for Hydrophone Applications, Bulletin of Materials Science, Sep. 1988, vol. 11, Issue 1, pp. 49-54.*

Park, Kwi-II, et al., "Flexible Nanocomposite Generator Made of BaTiO₃ Nanoparticles and Graphitic Carbons," Advanced Materials, vol. 24, May 2, 2012, pp. 2999-3004.

(Continued)

*Primary Examiner* — J. San Martin
(74) *Attorney, Agent, or Firm* — Sughrue Mion, PLLC

(57) ABSTRACT

A textile-based stretchable energy generator is provided. The energy generator includes: flexible and stretchable first and second electrode substrates; and an energy generation layer, which is provided between the first and second electrode substrates and includes a dielectric elastomer for generating electrical energy from a transformation thereof.

9 Claims, 6 Drawing Sheets

(56) References Cited

U.S. PATENT DOCUMENTS

| | | | |
|---|---|---|---|
| 2012/0013223 A1* | 1/2012 | Hsu et al. | 310/339 |
| 2012/0133247 A1* | 5/2012 | Lee et al. | 310/339 |
| 2013/0049530 A1* | 2/2013 | Koo et al. | 310/300 |
| 2013/0175901 A1* | 7/2013 | Cha et al. | 310/339 |
| 2014/0210313 A1* | 7/2014 | Kim et al. | 310/339 |
| 2014/0312737 A1* | 10/2014 | Jenninger et al. | 310/319 |
| 2014/0375170 A1* | 12/2014 | Jenninger et al. | 310/339 |

OTHER PUBLICATIONS

Fan, Feng-Ru, et al., "Flexible triboelectric generator!," Nano Energy, doi:10.1016/j.nanoen.2012.01.004, Jan. 2012, pp. 1-7.

Fan, Feng-Ru, et al., "Transparent Triboelectric Nanogenerators and Self-Powered Pressure Sensors Based on Micropatterned Plastic Films," Nano Letters, American Chemical Society, vol. 12, May 11, 2012, pp. 3109-3114.

\* cited by examiner

TEXTILE-BASED STRETCHABLE ENERGY GENERATOR

CROSS-REFERENCE TO RELATED APPLICATION

This application claims priority from Korean Patent Application No. 10-2012-0116749, filed on Oct. 19, 2012, in the Korean Intellectual Property Office, the disclosure of which is incorporated herein in its entirety by reference.

BACKGROUND

1. Field

Apparatuses consistent with exemplary embodiments relate to an energy generator, and more particularly, to a textile-based stretchable energy generator.

2. Description of the Related Art

Recently, flexible and stretchable devices, such as a wearable computer have been developed, and the implementation of flexible and stretchable electronic devices demands an energy generator for supplying suitable electrical energy. Since an energy generator produced as a solid material lacks flexibility and stretchability, it is difficult to use such an energy generator together with a stretchable electronic device, and it is also difficult to use such an energy generator together with a miniaturized and light-weighted electronic device. In addition, recently, an energy harvesting technique has been researched. Devices for harvesting energy may be referred to as new environment-friendly energy generation devices for converting wind or vibrations or mechanical energy generated from a motion of the human being into electrical energy and extracting the converted electrical energy. In addition, recently, along with the development of nanotechnology, research has been conducted into developing a flexible and stretchable energy generator using a nanosystem capable of harvesting electrical energy.

SUMMARY

One or more exemplary embodiments may provide a textile-based stretchable energy generator.

Additional exemplary aspects will be set forth in part in the description which follows and, in part, will be apparent from the description, or may be learned by practice of the presented exemplary embodiments.

According to an aspect of an exemplary embodiment, an energy generator includes: flexible and stretchable first and second electrode substrates; and an energy generation layer, which is provided between the first and second electrode substrates and includes a dielectric elastomer for generating electrical energy from transformation.

Each of the first and second electrode substrates may include a flexible and stretchable textile and an electrode layer coated on the textile. The electrode layer may include at least one selected from a group consisting of, for example, gold (Au), silver (Ag), copper (Cu), and nickel (Ni). The first and second electrode substrates may have an elongation percentage of about 10% to about 100%.

The dielectric elastomer may include at least one material selected from a group consisting of natural rubber, silicone rubber, acrylic rubber, and copolymer.

The energy generation layer may further include a dielectric property improving material. The dielectric property improving material may include at least one element selected from a group consisting of, for example, a single-wall nanotube (SWNT), a multi-wall nanotube (MWNT), a carbon particle, an acrylic polymer, and a conductive polymer.

The energy generation layer may further include a piezoelectric material. The piezoelectric material may include at least one material selected from a group consisting of, for example, zinc oxide (ZnO), barium titanium trioxide (BaTiO$_3$), sodium niobium trioxide (NaNbO$_3$), lead zirconate titanate (PZT), poly-vinylidene fluoride (PVDF), and a PVDF copolymer derivative. The piezoelectric material may be embedded in the dielectric elastomer. The piezoelectric material may have a shape of a nanoparticle, a nanowire, a nanorod, a nanofiber, or a nanoflower.

The energy generator may include the form of woven fabrics. The energy generator may further include a protection member for enclosing the first and second electrode substrates and the energy generation layer.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
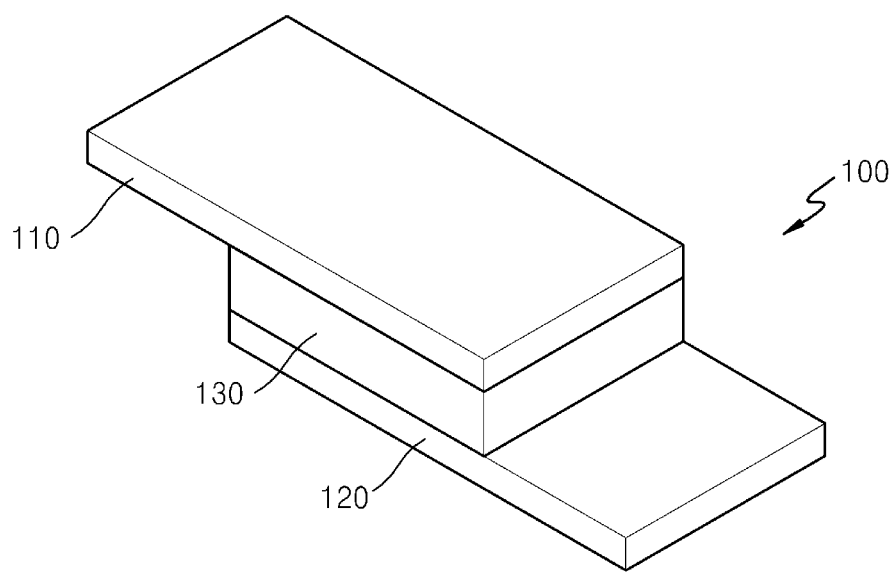
FIG. 1 is a perspective view of a textile-based stretchable energy generator according to an exemplary embodiment.

Reference will now be made in detail to embodiments, examples of which are illustrated in the accompanying drawings. The embodiments illustrated below do not limit the scope of the present disclosure and are provided to describe the present disclosure to one of ordinary skill in the art. In the drawings, like reference numerals refer to the like elements, and sizes and thicknesses of components may be exaggerated for clarity of description. In this regard, the present embodiments may have different forms and should not be construed as being limited to the descriptions set forth herein. Accordingly, the embodiments are merely described below, by referring to the figures, to explain aspects of the present description. As used herein, expressions such as "at least one of," when preceding a list of elements, modify the entire list of elements and do not modify the individual elements of the list.

Figure 2:
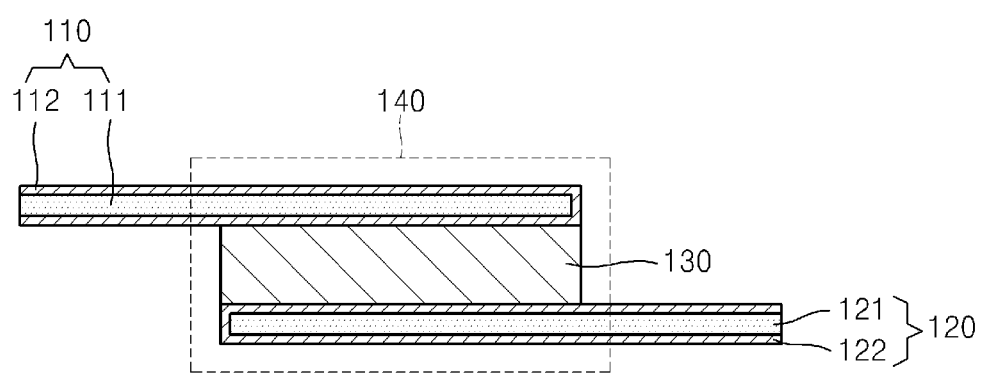
FIG. 2 is a cross-sectional view of the energy generator of FIG. 1.

FIG. 1 is a perspective view of a textile-based stretchable energy generator 100 according to an exemplary embodiment. FIG. 2 is a cross-sectional view of the energy generator 100 of FIG. 1.

Referring to FIGS. 1 and 2, the energy generator 100 includes first and second electrode substrates 110 and 120 separated from each other and an energy generation layer 130 provided between the first and second electrode substrates 110 and 120. The first and second electrode substrates 110 and 120 may be textile-based electrode substrates. In detail, the first electrode substrate 110 may include a flexible and stretchable first textile 111 and a first electrode layer 112 coated on the first textile 111. The second electrode substrate 120 may include a flexible and stretchable second textile 121 and a second electrode layer 122 coated on the second textile 121. The first and second textiles 111 and 121 may include, for example, a common textile material used for clothes or fabrics but are not limited thereto.

Each of the first and second electrode layers 112 and 122 may be of a metal having excellent conductivity, for example, at least one metal selected from the group consisting of gold (Au), silver (Ag), copper (Cu), and nickel (Ni). However, the first and second electrode layers 112 and 122 are not limited thereto and may include various other conductive metals. The first and second electrode substrates 110 and 120 may have flexibility and stretchability. The first and second electrode substrates 110 and 120 may have, for example, an elongation percentage of about 10% to about 100%. However, this is only illustrative, and the first and second electrode substrates 110 and 120 are not necessarily limited thereto.

The energy generation layer 130 is provided between the first and second electrode substrates 110 and 120. The energy generation layer 130 may include a dielectric elastomer capable of generating electrical energy by transformation, such as elongation or contraction. The dielectric elastomer may increase the generation of electrical energy by improving the dielectric property, i.e., a permittivity, thereof. The dielectric elastomer may include at least one selected from the group consisting of natural rubber, silicone rubber, acrylic rubber, and copolymer. However, this is only illustrative, and the dielectric elastomer may include other various materials. The first and second electrode substrates 110 and 120 and the energy generation layer 130 may be enclosed by a protection member 140. The protection member 140 may include a flexible and stretchable material. As described above, the flexible and stretchable energy generator 100 may be used in the form of woven fabrics. However, this is only illustrative, and the energy generator 100 may be used in the form of non-woven fabrics.

Figure 3A:
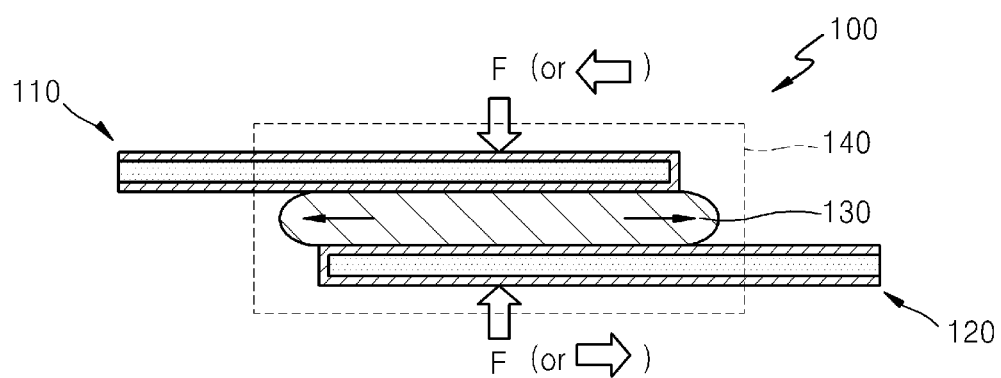
FIGS. 3A and 3B are figures in which an energy generation layer of the energy generator of FIG. 1 is transformed.
Figure 3B:
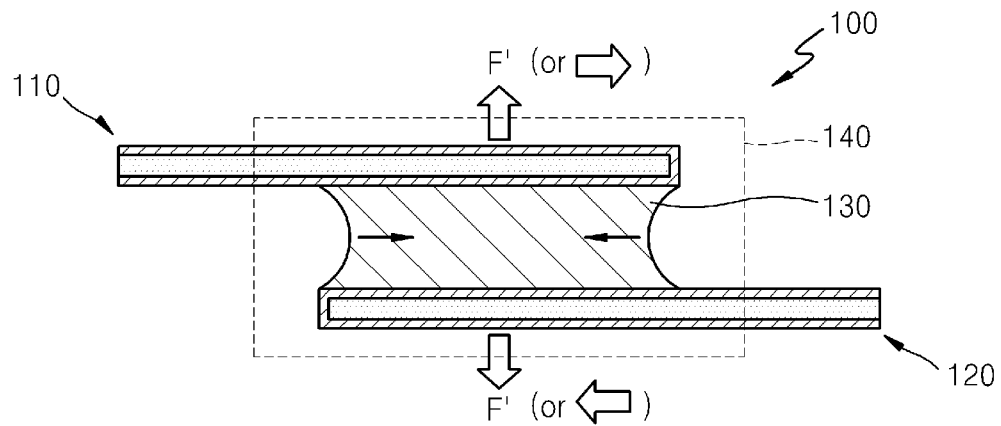

FIGS. 3A and 3B are figures in which the energy generator 100 is transformed by applying forces F and F' generated from an external environment to the energy generator 100, respectively. Referring to FIG. 3A, when the force F pushing upwards and downwards, toward the energy generation layer 130, is applied to the energy generation layer 130 between the first and second electrode substrates 110 and 120, the energy generation layer 130 elongates, bulging outward, thereby resulting in an increase in a length of the energy generation layer 130. Referring to FIG. 3B, when the force F' pulling upwards and downwards is applied to the energy generation layer 130 between the first and second electrode substrates 110 and 120, the energy generation layer 130 contracts, thereby resulting in a decrease in a length of the energy generation layer 130. As described above, when the energy generation layer 130 including a dielectric elastomer elongates or contracts, the transformation of the energy generation layer 130 causes electrical energy to be generated, and the generated electrical energy may be applied to a load (not shown) via the first and second electrode substrates 110 and 120 or stored in a capacitor (not shown). The energy generation layer 130 may further include a dielectric property improving material (refer to 337 of FIG. 5) to be described below. The dielectric property improving material may generate more electrical energy by transformation of the dielectric elastomer by improving a permittivity of the dielectric elastomer. The dielectric property improving material may include at least one selected from the group consisting of, for example, a single-wall nanotube (SWNT), a multi-wall nanotube (MWNT), a carbon particle, an acrylic polymer, and a conductive polymer but is not limited thereto.

The energy generator 100 may efficiently generate electrical energy by the transformation of the energy generation layer 130 including a dielectric elastomer due to mechanical energy generated from the wind or vibrations existing in the surrounding environments or a motion of the human being. In addition, the energy generator 100 may be applied to various fields, such as wearable devices, buildings having a wide area, and so forth, in which the surrounding environments are used, according to the flexible and stretchable characteristics thereof.

Figure 4:
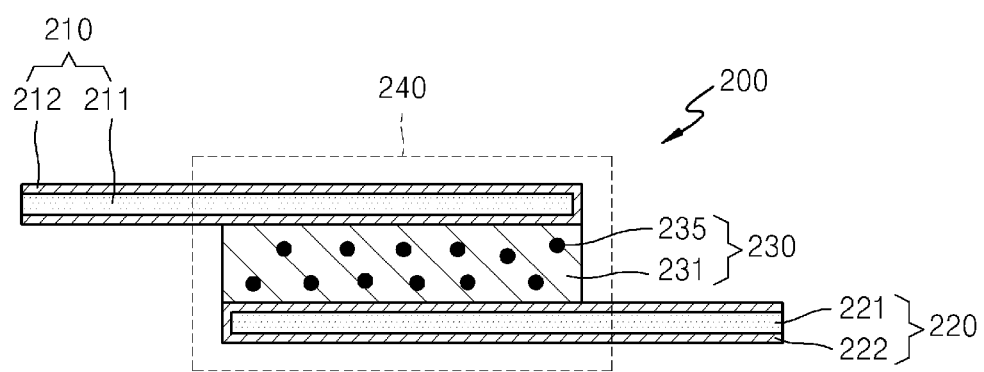
FIG. 4 is a cross-sectional view of a textile-based stretchable energy generator according to another exemplary embodiment.

FIG. 4 is a cross-sectional view of a textile-based stretchable energy generator 200 according to another exemplary embodiment. Hereinafter, mainly the matters different from the embodiment described above will be described.

Referring to FIG. 4, first and second electrode substrates 210 and 220 are provided to be separated from each other, and an energy generation layer 230 is provided between the first and second electrode substrates 210 and 220. The first electrode substrate 210 may include a flexible and stretchable first textile 211 and a first electrode layer 212 coated on the first textile 211. The second electrode substrate 220 may include a flexible and stretchable second textile 221 and a second electrode layer 222 coated on the second textile 221. Each of the first and second electrode layers 212 and 222 may be of, for example, at least one metal selected from the group consisting of Au, Ag, Cu, and Ni. The first and second electrode substrates 210 and 220 may have flexibility and stretchability. The first and second electrode substrates 210 and 220 may have, for example, an elongation percentage of about 10% to about 100% but are not limited thereto.

The energy generation layer 230 is provided between the first and second electrode substrates 210 and 220. The energy generation layer 230 may include a dielectric elastomer 231 and a piezoelectric material 235. The dielectric elastomer 231 may generate electrical energy by transformation, such as elongation or contraction, and the piezoelectric material 235 may generate electrical energy by being transformed due to pressure. The piezoelectric material 235 may be embedded in the dielectric elastomer 231. The dielectric elastomer 231 may include at least one selected from the group consisting of natural rubber, silicone rubber, acrylic rubber, and copolymer but is not limited thereto. The piezoelectric material 235 may include at least one selected from the group consisting of, for example, a zinc oxide (ZnO), a barium titanium trioxide ($BaTiO_3$), a sodium niobium trioxide ($NaNbO_3$), a lead zirconate titanate (PZT), a poly-vinylidene fluoride (PVDF), and PVDF copolymer derivatives. The piezoelectric material 235 may be embedded in the dielectric elastomer 231 in a shape of a plurality of nanoparticles, nanowires, nanorods, nanofibers, or nanoflowers. The nanowires may each have an aspect ratio of about 1:20 to about 1:100. The nanorods may each have a lower aspect ratio than the nanowires, and the nanofibers may have a higher aspect ratio than the nanowires. FIG. 4 shows a case where the piezoelectric material 235 is embedded in the dielectric elastomer 231 in a shape of nanoparticles. The first and second electrode substrates 210 and 220 and the energy generation layer 230 may be enclosed by a protection member 240. The protection member 240 may include a flexible and stretchable material. As described above, the flexible and stretchable energy generator 200 may be used in the form of woven fabrics. However, this is only illustrative, and the energy generator 200 may be used in the form of non-woven fabrics.

Since the energy generator 200 includes not only the dielectric elastomer 231 but also the piezoelectric material 235, the energy generator 200 may generate more electrical energy than may be generated according to the embodiment described above. In addition, the energy generator 200 may also be applied to fields, such as wearable devices and so forth, according to the flexible and stretchable characteristics thereof.

Figure 5:
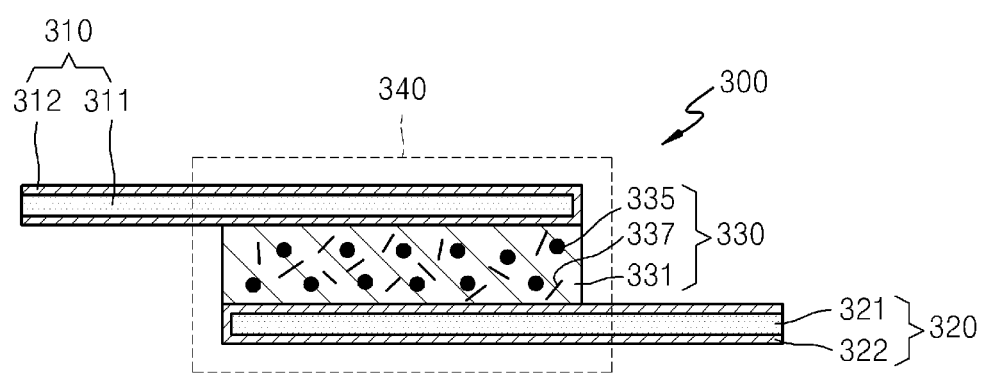
FIG. 5 is a cross-sectional view of a textile-based stretchable energy generator according to another exemplary embodiment.

FIG. 5 is a cross-sectional view of a textile-based stretchable energy generator 300 according to another exemplary embodiment. Hereinafter, the matters different from the embodiment described above will be mainly described.

Referring to FIG. 5, first and second electrode substrates 310 and 320 are provided to be separated from each other, and an energy generation layer 330 is provided between the first and second electrode substrates 310 and 320. The first electrode substrate 310 may include a flexible and stretchable first textile 311 and a first electrode layer 312 coated on the first textile 311. The second electrode substrate 320 may include a flexible and stretchable second textile 321 and a second electrode layer 322 coated on the second textile 321. Each of the first and second electrode layers 312 and 322 may be of, for example, at least one metal selected from the group consisting of Au, Ag, Cu, and Ni. The first and second electrode substrates 310 and 320 may have flexibility and stretchability. The first and second electrode substrates 310 and 320 may have, for example, an elongation percentage of about 10% to about 100% but are not limited thereto.

The energy generation layer 330 is provided between the first and second electrode substrates 310 and 320. The energy generation layer 330 may include a dielectric elastomer 331, a piezoelectric material 335, and a dielectric property improving material 337. The dielectric elastomer 331 may generate electrical energy by transformation, such as elongation or contraction, and the piezoelectric material 335 may generate electrical energy by being transformed due to pressure. The piezoelectric material 335 may be embedded in the dielectric elastomer 331. The dielectric property improving material 337 is provided to increase a permittivity of the dielectric elastomer 331, and if the dielectric property improving material 337 is included in the dielectric elastomer 331, the permittivity of the dielectric elastomer 331 may increase, thereby generating more electrical energy.

The dielectric elastomer 331 may include at least one selected from the group consisting of, for example, natural rubber, silicone rubber, acrylic rubber, and copolymer but is not limited thereto. The piezoelectric material 335 may include at least one selected from the group consisting of, for example, ZnO, $BaTiO_3$, $NaNbO_3$, PZT, PVDF, and PVDF copolymer derivatives. The piezoelectric material 335 may be embedded in the dielectric elastomer 331 in a shape of nanoparticles, nanowires, nanorods, nanofibers, or nanoflowers. FIG. 5 shows a case where the piezoelectric material 335 is embedded in the dielectric elastomer 331 in a shape of nanoparticles. The dielectric property improving material 337 may include at least one selected from the group consisting of, for example, an SWNT, an MWNT, a carbon particle, an acrylic polymer, and a conductive polymer. The first and second electrode substrates 310 and 320 and the energy generation layer 330 may be enclosed by a protection member 340. The protection member 340 may include a flexible and stretchable material. As described above, the flexible and stretchable energy generator 300 may be used in the form of woven fabrics. However, this is only illustrative, and the energy generator 300 may be used in the form of non-woven fabrics.

Since the energy generator 300 includes not only the dielectric elastomer 331 and the piezoelectric material 335 but also the dielectric property improving material 337, the energy generator 300 may generate more electrical energy than may be generated according to the embodiments described above. In addition, the energy generator 300 may also be applied to fields, such as wearable devices and so forth, according to the flexible and stretchable characteristics thereof.

Figure 6A:
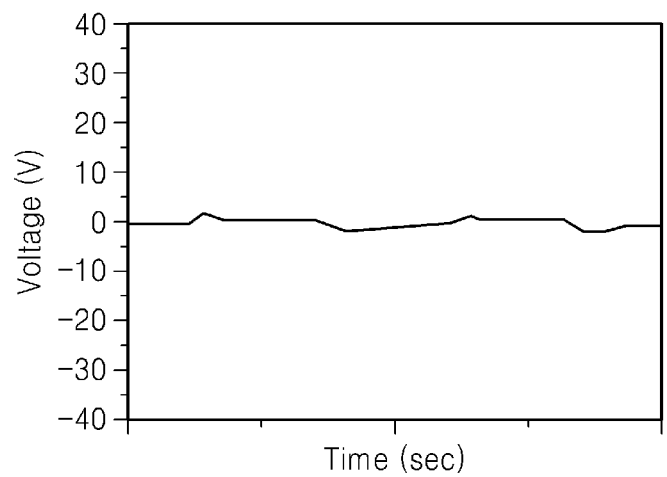
FIGS. 6A and 6B are graphs of an output voltage and an output current of the energy generator of FIG. 1, which includes an energy generation layer having silicone rubber.
Figure 6B:
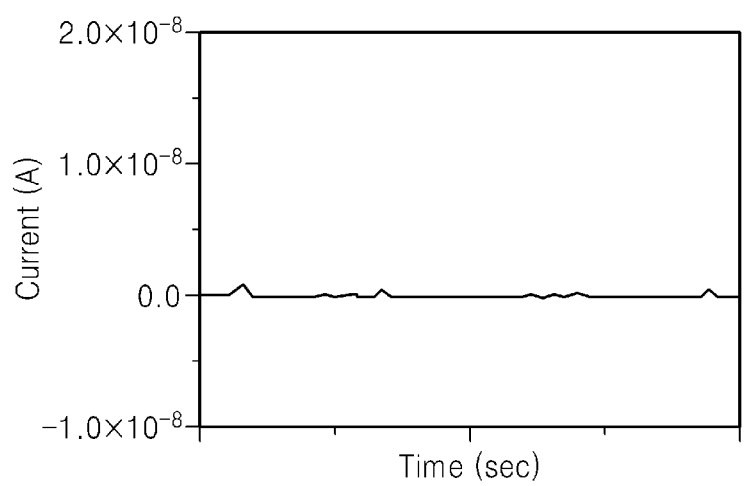
Figure 7A:
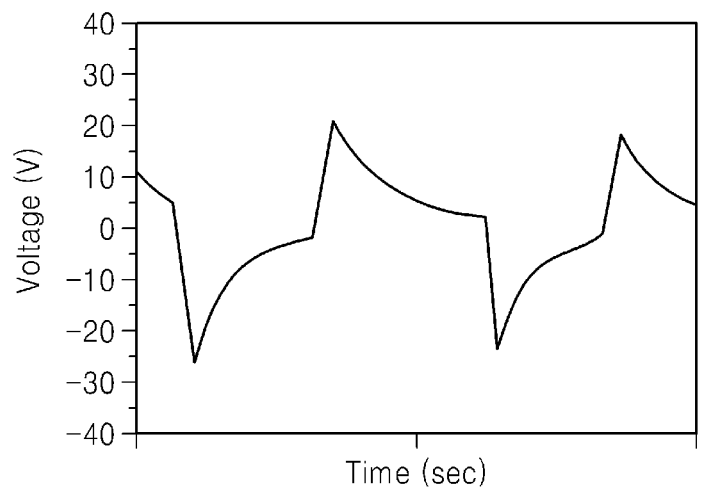
FIGS. 7A and 7B are graphs of an output voltage and an output current of the energy generator of FIG. 4, which includes an energy generation layer having silicone rubber and zinc oxide (ZnO) nanoparticles.
Figure 7B:
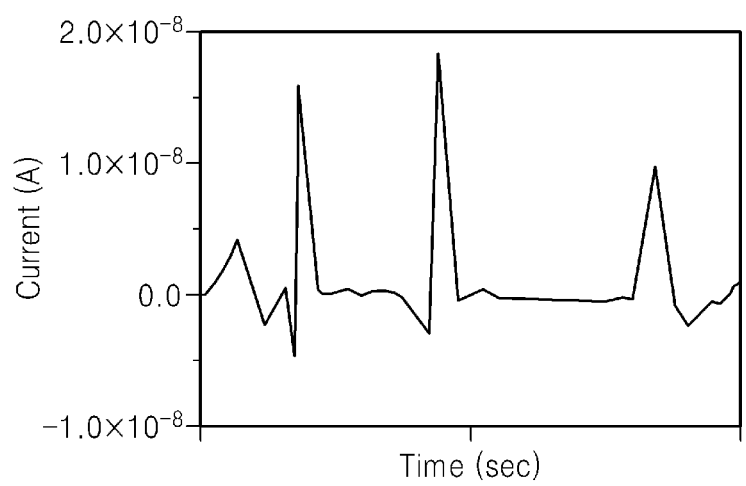

FIGS. 6A and 6B are graphs of an output voltage and an output current of the energy generator 100 of FIG. 1 in which the energy generation layer 130 includes silicone rubber. FIGS. 6A and 6B respectively show an output voltage and an output current when a pushing force of 10 N is applied to a unit area (1 cm×1 cm) of the energy generator 100 of FIG. 1. Referring to FIGS. 6A and 6B, a maximum peak output voltage and a maximum peak output current are 1.8 V and 0.86 nA, respectively. FIGS. 7A and 7B are graphs of an output voltage and an output current of the energy generator 200 of FIG. 4 in which the energy generation layer 230 includes silicone rubber and ZnO nanoparticles. FIGS. 7A and 7B respectively show an output voltage and an output current when a pushing force of 10 N is applied to a unit area (1 cm×1 cm) of the energy generator 200 of FIG. 4. Referring to FIGS. 7A and 7B, a maximum peak output voltage and a maximum peak output current are 20 V and 16 nA, respectively. Thus, the energy generator 200 of FIG. 4, which includes the energy generation layer 230 including the dielectric elastomer 231 and the piezoelectric material 235, may generate a higher output voltage and a higher output current than the energy generator 100 of FIG. 1, which includes the energy generation layer 130 including only the dielectric elastomer.

Figure 8A:
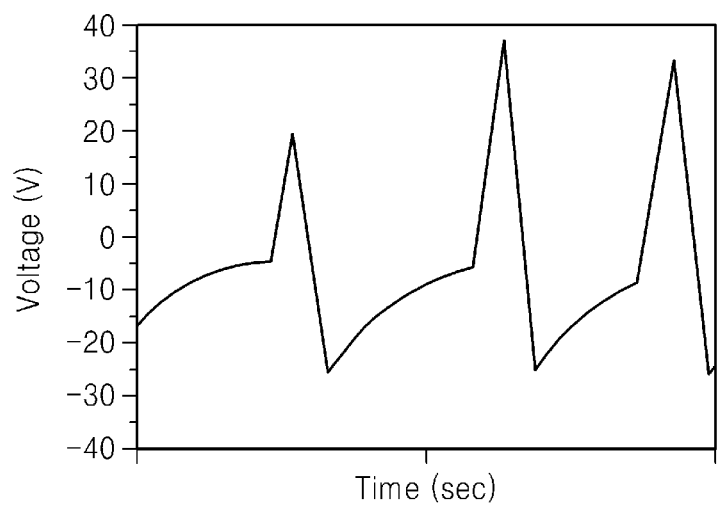
FIGS. 8A and 8B are graphs of an output voltage and an output current of the energy generator of FIG. 5, which includes an energy generation layer having silicone rubber, ZnO nanoparticles, and multi-wall nanotubes (MWNTs).
Figure 8B:
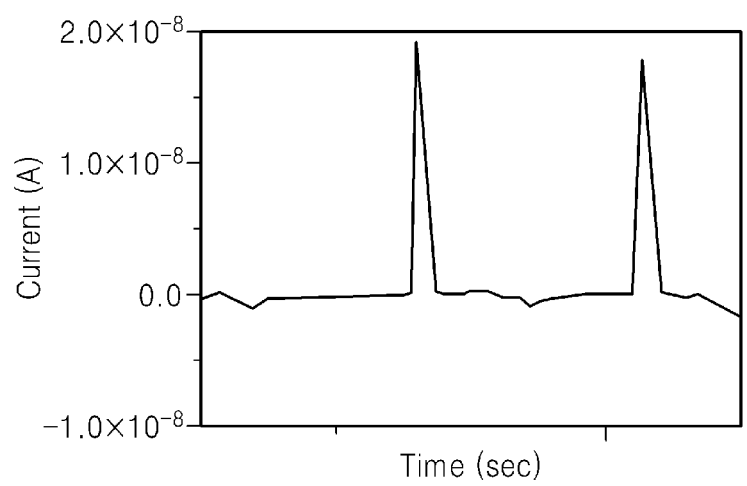

FIGS. 8A and 8B are graphs of an output voltage and an output current of the energy generator 300 of FIG. 5 in which the energy generation layer 330 includes silicone rubber, ZnO nanoparticles, and MWNTs. FIGS. 8A and 8B respectively show an output voltage and an output current when a pushing force of 10 N is applied to a unit area (1 cm×1 cm) of the energy generator 300 of FIG. 5. Referring to FIGS. 8A and 8B, a maximum peak output voltage and a maximum peak output current are 25 V and 18 nA, respectively. Thus, the energy generator 300 of FIG. 5, which includes the energy generation layer 330 including the dielectric elastomer 331, the piezoelectric material 335, and the dielectric property improving material 337, may generate a higher output voltage and a higher output current than the energy generator 100 of FIG. 1, which includes the energy generation layer 130 including the dielectric elastomer, or the energy generator 200 of FIG. 4, which includes the energy generation layer 230 including the dielectric elastomer 231 and the piezoelectric material 235.

As described above, according to one or more of the above exemplary embodiments, an energy generator may effectively generate electrical energy by the transformation of an energy generation layer including a dielectric elastomer or including a dielectric elastomer and a piezoelectric material due to mechanical energy generated from the wind or vibrations existing in the surrounding environments or a motion of the human being. In addition, the energy generator may be applied to various fields, such as wearable electronic devices, buildings having a wide area, and so forth, in which the surrounding environments are used, according to the flexible and stretchable characteristics thereof.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An energy generator comprising:
   a first electrode substrate which is flexible and stretchable;
   a second electrode substrate which is flexible and stretchable; and
   an energy generation layer disposed between the first electrode substrate and the second electrode substrate, wherein the energy generation layer comprises a dielectric elastomer, which generates electrical energy by transformation due to pressure and a piezoelectric material embedded in the dielectric elastomer,
   wherein the piezoelectric material comprises at least one material selected from a group consisting of zinc oxide (ZnO), sodium niobium trioxide (NaNbO$_3$), lead zirconate titanate (PZT), poly-vinylidene fluoride (PVDF), and a PVDF copolymer derivative, and
   wherein each of the first electrode substrate and the second electrode substrate comprises a textile which is flexible and stretchable and an electrode layer coated on the textile.

2. The energy generator of claim 1, wherein the electrode layer comprises at least element one selected from a group consisting of gold (Au), silver (Ag), copper (Cu), and nickel (Ni).

3. The energy generator of claim 1, wherein each of the first electrode substrate and the second electrode substrate has an elongation percentage of about 10% to about 100%.

4. The energy generator of claim 1, wherein the dielectric elastomer comprises at least one material selected from a group consisting of natural rubber, silicone rubber, acrylic rubber, and copolymer.

5. The energy generator of claim 1, wherein the energy generation layer further comprises a material which improves a dielectric property of the dielectric elastomer.

6. The energy generator of claim 5, wherein the dielectric property improving material includes at least one element selected from a group consisting of a single-wall nanotube, a multi-wall nanotube, a carbon particle, an acrylic polymer, and a conductive polymer.

7. The energy generator of claim 1, wherein the piezoelectric material has a shape of a nanoparticle, a nanowire, a nanorod, a nanofiber, or a nanoflower.

8. The energy generator of claim 1, wherein the textile is a woven fabric.

9. The energy generator of claim 1, further comprising a protection member which encloses the first and second electrode substrates and the energy generation layer.

* * * * *